United States Patent
Bhatti et al.

(10) Patent No.: US 10,403,495 B2
(45) Date of Patent: *Sep. 3, 2019

(54) SN DOPED ZNS NANOWIRES FOR WHITE LIGHT SOURCE MATERIAL

(71) Applicant: COMSATS University Islamabad, Islamabad (PK)

(72) Inventors: Arshad Saleem Bhatti, Islamabad (PK); Uzma Nosheen, Islamabad (PK); Liaquat Aziz, Islamabad (PK); Nashmia Sabih, Islamabad (PK)

(73) Assignee: COMSATS UNIVERSITY ISLAMABAD, Islamabad (PK)

( * ) Notice: Subject to any disclaimer, the term of this patent is extended or adjusted under 35 U.S.C. 154(b) by 0 days.

This patent is subject to a terminal disclaimer.

(21) Appl. No.: 16/057,801

(22) Filed: Aug. 7, 2018

(65) Prior Publication Data

US 2019/0043717 A1 Feb. 7, 2019

Related U.S. Application Data

(63) Continuation of application No. 15/683,989, filed on Aug. 23, 2017, now Pat. No. 10,096,469.

(30) Foreign Application Priority Data

Aug. 24, 2016 (PK) .................................... 520/2016

(51) Int. Cl.
*H01L 21/02* (2006.01)
*H01L 33/00* (2010.01)
*H01L 33/28* (2010.01)

(52) U.S. Cl.
CPC .. *H01L 21/02474* (2013.01); *H01L 21/02381* (2013.01); *H01L 21/02557* (2013.01); *H01L 21/02603* (2013.01); *H01L 21/02631* (2013.01); *H01L 21/02664* (2013.01); *H01L 33/0095* (2013.01); *H01L 33/28* (2013.01)

(58) Field of Classification Search
CPC combination set(s) only.
See application file for complete search history.

(56) References Cited

U.S. PATENT DOCUMENTS

2010/0139750 A1 6/2010 Kim et al.
2015/0207028 A1* 7/2015 Romano

OTHER PUBLICATIONS

Notice of Allowance dated Jul. 26, 2018, in U.S. Appl. No. 15/683,989.

* cited by examiner

*Primary Examiner* — Tony Tran
(74) *Attorney, Agent, or Firm* — H.C. Park & Associates, PLC

(57) ABSTRACT

According to exemplary embodiments, a method of synthesizing tin (Sn)-doped Zinc Sulfide (ZnS) nanostructures for electroluminescent white light source includes coating a substrate, including a silicon oxide layer, with Sn by vacuuming depositing Sn as catalyst nanostructures on the substrate, placing the substrate coated with Sn in a furnace, introducing a carrier flow gas into the furnace, adding a ZnS power to the furnace, growing ZnS nanostructures, and dissolving Sn in the growing ZnS nanostructures. The S vacancies are on a surface of the ZnS nanostructures. The ZnS nanostructures are grown on the substrate having a temperature in a range of 750° C. to 850° C.

3 Claims, 5 Drawing Sheets

(a) Electroluminescent current device (b) Electroluminescent tunnel device (a) Electroluminescent current device (b) Electroluminescent tunnel device

SN DOPED ZNS NANOWIRES FOR WHITE LIGHT SOURCE MATERIAL

CROSS-REFERENCE TO RELATED APPLICATION

This application is a continuation of U.S. patent application Ser. No. 15/683,989, filed on Aug. 23, 2017, and claims priority from and the benefit of Pakistan Provisional Application No. 520/2016, filed on Aug. 24, 2016, which is hereby incorporated by reference for all purposes as if fully set forth herein.

BACKGROUND

Field

Exemplary embodiments relate to a method using vapor liquid solid (VLS) for the synthesis of nanostructures for an electroluminescent source. More particularly, exemplary embodiments relate to the synthesis of tin (Sn) self doped Zinc Sulfide (ZnS) nanostructures for electroluminescent white light source.

Discussion of the Background

White light is produced by combining, in a proper combination, three basic colors, i.e., red (R), green (G), and blue (B). Based on the proportional weight of red or blue, the light source can be labeled as warm or cool. Presently, there are two ways of producing white light, by having three LEDs (RGB) as three sources of colors and using blue LED and two phosphor coated materials. Both techniques have their advantages and disadvantages. Economic cost is a large issue related to white light sources. So far, enormous efforts are being made to develop either technology or fabricate a material that can produce white light at low cost.

ZnS is a wide band gap material with an energy gap of 3.7 electron volt (eV). Crystal structures of ZnS can have two major structural defects, i.e., Zn vacancies and S vacancies. The two vacancies lead to formation of defect energy states in the band gap that are highly luminescent. S vacancies lead to emission blue color at 440 nm and Zn vacancies lead to emission of green wavelength at 520 nm, which are well established in the art. Due to the dominance of Zn vacancies, ZnS is being used as green phosphor material or green electroluminescence material. However, if ZnS is doped with either Au, Mn, Ga or Sn. A third low energy band may be introduced into the band gap, which may lead to emission of red wavelength light, i.e., in 600-650 nm range. The amount of Zn and S vacancies has been reported to depend strongly on the choice of catalysts, growth, and post growth processing conditions. Incorporation of metal ions may provide an efficient radiative channel by introducing defect states in the middle of band gap. Introduction of extrinsic defects also alter the balance of various optically active states participating in the recombination processes and thus substantially modify the radiative recombination channels and kinetics in the host material. Thus, the choice and location of the metal ion in the host lattice is very important for defining the radiative recombination pathways.

The above information disclosed in this Background section is only for enhancement of understanding of the background of the inventive concept, and, therefore, it may contain information that does not form the prior art that is already known in this country to a person of ordinary skill in the art.

SUMMARY

Under proper growth conditions, properly doped ZnS nanowires may emit all three fundamental colors to produce white light. In the present embodiments, synthesis of ZnS nanowires using Sn as a catalyst dopant that under certain growth conditions produces all three colors from a single material (ZnS) is demonstrated.

Additional aspects will be set forth in the detailed description which follows, and, in part, will be apparent from the disclosure, or may be learned by practice of the inventive concept.

According to exemplary embodiments, a method of synthesizing tin (Sn)-doped Zinc Sulfide (ZnS) nanostructures for electroluminescent white light source includes coating a substrate, including a silicon oxide layer, with Sn by vacuuming depositing Sn as catalyst nanostructures on the substrate, placing the substrate coated with Sn in a furnace, introducing a carrier flow gas into the furnace, adding a ZnS power to the furnace, growing ZnS nanostructures, and dissolving Sn in the growing ZnS nanostructures. The S vacancies are on a surface of the ZnS nanostructures. The ZnS nanostructures are grown on the substrate having a temperature in a range of 750° C. to 850° C.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

Figure 1A:
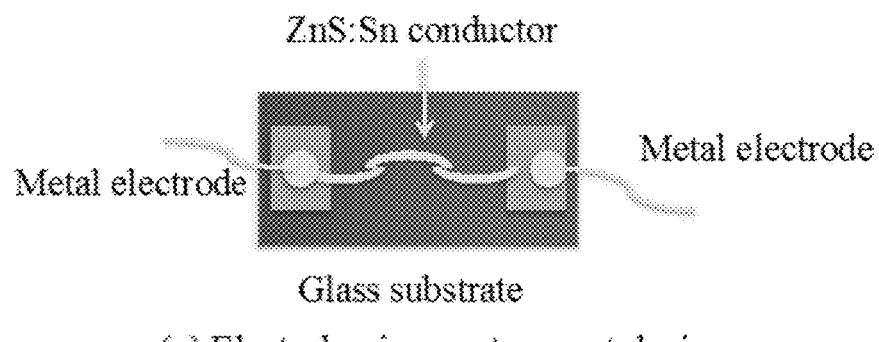
FIGS. 1A and 1B are a device designs for ZnS:Sn based electroluminescent devices for (a) current based, and (b) tunnel based sandwich devices.

The Figures also show fluorescent images of same samples showing the difference in emission patterns.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of elements may be exaggerated for clarity and descriptive purposes. Also, like reference numerals denote like elements.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, and/or regions, these elements, components, and/or regions should not be limited by these terms. These terms are used to distinguish one element, component, and/or region from another element, component, and/or region. Thus, a first element, component, and/or region discussed below could be termed a second element, component, and/or region without departing from the teachings of the present disclosure.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Figure 1B:
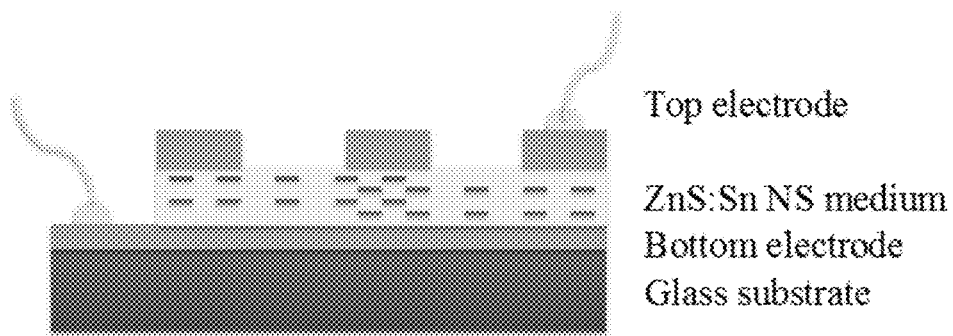

Design:

An electroluminescent (EL) device consisting of ZnS nanowires/nanostructures doped with suitable concentration of Sn as phosphor material in the device that works on the principle of excitation through current flow (FIG. 1A) in the device or applied electric field in a sandwich structure (FIG. 1B). There are three strong luminescent centers in the Sn doped ZnS nanostructures, namely, S vacancies responsible for the blue band, Zn vacancies for the green band and $Sn^{2+/4+}$ states for the red band emission. Electrons are accelerated through the nanowires of ZnS and excite carriers from the valence band to the defect states through the conduction band. The excited carriers relax to the defect states (S, Zn vacancies and $Sn^{2+/4+}$ ionized dopants), producing luminescence.

Synthesis:

ZnS nanowires may be synthesized on Si (100) substrates with a thin (2-3 nm) native oxide layer and a Sn catalyst. Ultra-thin film (2 nm thick) of Sn may be deposited on Si substrates by thermal evaporation at room temperature at a base pressure of $3 \times 10^{-6}$ Torr Prior to deposition, substrates may be ultrasonically cleaned. The Sn coated substrates may then be placed in a single zone horizontal tube furnace along with precursor (ZnS) powder in an alumina boat. The precursor material may be placed at the center of the tube and multiple substrates may be placed in downstream and away from the precursor. The furnace may be heated to 1000° C. in a continuous flow of a mixture of hydrogen ($H_2$) (5%) and nitrogen ($N_2$) (95%) gases at 20 standard cubic centimeter per minute (Sccm). Measured substrate temperatures may be 850° C., 800° C., 780° C., and 750° C. Growth may be performed for 2 hours. Finally synthesized ZnS nanostructures may be furnace cooled under a flowing $N_2$ atmosphere.

Optical Characterization:

FIGS. 3A, 3B, 3C, and 3D show the room temperature photoluminescence spectra and corresponding fluorescence microscopy images of ZnS nanowires synthesized using Sn as a catalyst at various growth temperatures. The fluorescence images may be obtained by exciting with a UV lamp. The photoluminescence spectra may be obtained at room temperature by exciting with 325 nm He—Cd laser and normalized to the spectrometer and detector response.

The growth temperature showed profound effect on the photoluminescence properties of ZnS nanowires. This was due to a play between the intrinsic defects and doping of catalyst during growth, which was different at different growth temperatures. The results shown in FIGS. 3A, 3B, 3C and 3D demonstrate that the photoluminescence spectra changed its lineshape in nanowires grown at different temperatures. At high temperature growth, Sn defects were substantially dominant, but as the growth temperature was reduced, the balance between intrinsic and extrinsic defects changed and in ZnS nanowires grown at 780° C., a broadband spectrum was observed between 400 nm to 700 nm. In ZnS nanowires grown at lower temperatures, the balance was again disturbed and green and red luminescence was dominant. It was observed that blue emission due to S vacancies may be sensitive to various factors, including, surface to volume ratio and incorporation of Sn as a dopant.

The presence of three fundamental colors show the Sn doped ZnS nanowires as a promising material for white light source. This also introduces the possibility to tune various colors from a single source. The role of Sn doping in the optical properties of ZnS nanowires was shown when Sn doping in ZnS nanostructures produces more relaxed S vacancy ZnS structures at the surface, responsible for blue light emission. This was observed that only in a very small window of growth conditions, S vacancies dominate and hence become dominant for blue emission. This makes Sn doped ZnS nanostructures ideal to fabricate multi-color lasers or LEDs.

Figure 2A:
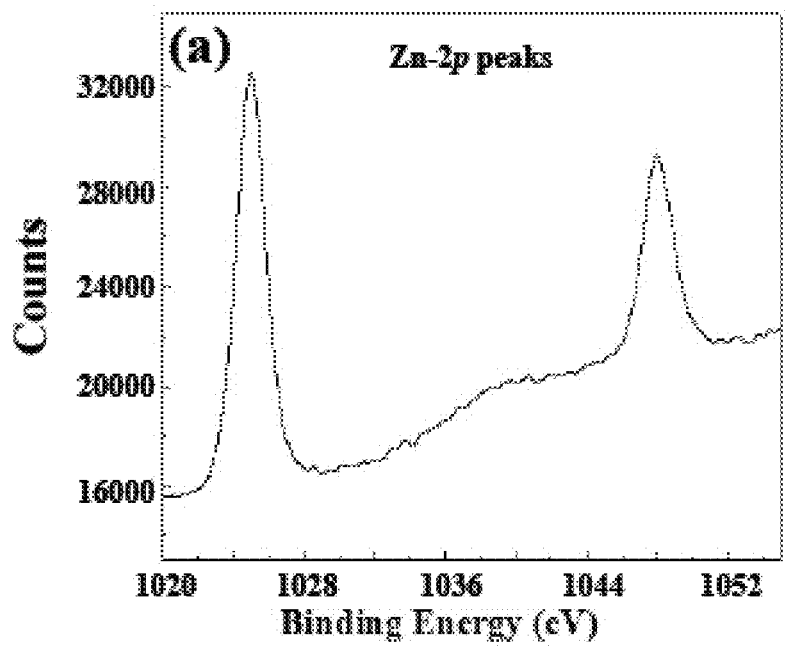
FIGS. 2A, 2B, and 2C are the X-ray photoelectron spectroscopy (XPS) data of the ZnS:Sn catalyzed and doped nanostructures showing Zn-2p, Sn-3d, and S-2p peaks.
Figure 2B:
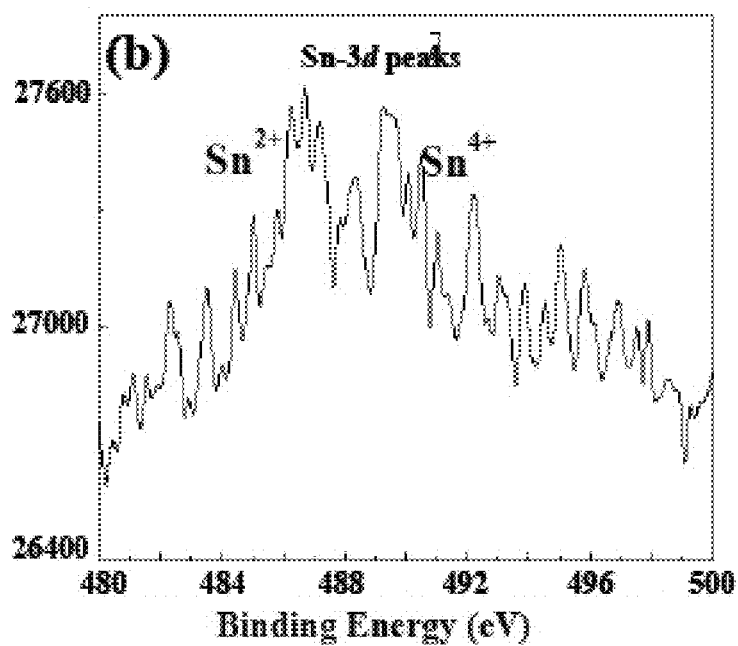
Figure 2C:
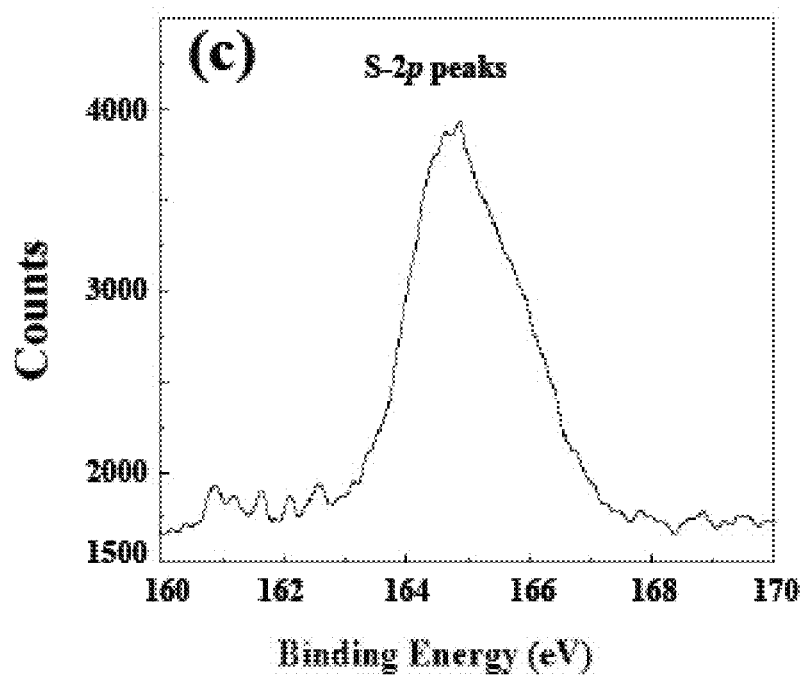

FIGS. 2A, 2B, and 2C show the XPS data collected during the visit from one sample of ZnS doped with Sn at 780° C. It shows significant amount of Sn present, which was also apparent from the photoluminescence spectra.

Photoluminescence Spectroscopy

Room temperature photoluminescence spectroscopy was performed to observe the emission spectrum of ZnS:Sn nanostructures grown at different temperatures shown in FIGS. 3A, 3B, 3C, and 3D.

Figure 3A:
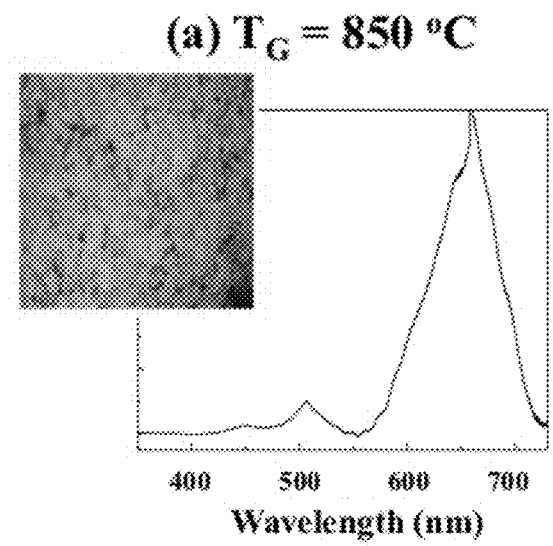
FIGS. 3A, 3B, 3C, and 3D are room temperature PL spectra from the ZnS nanostructures doped with Sn grown at different temperatures.

As shown in FIG. 3A, ZnS:Sn grown at 850° C. had mainly red emission in a relatively sharp band centered at 650 nm, which may be attributed to the presence of overwhelming number of $Sn^{2+/4+}$ states. Absence of emission bands at 440 nm and 520 nm may show nonexistence of S and Zn vacancies, respectively. This may be clearly observed in the fluorescent image shown with the spectra.

Figure 3B:
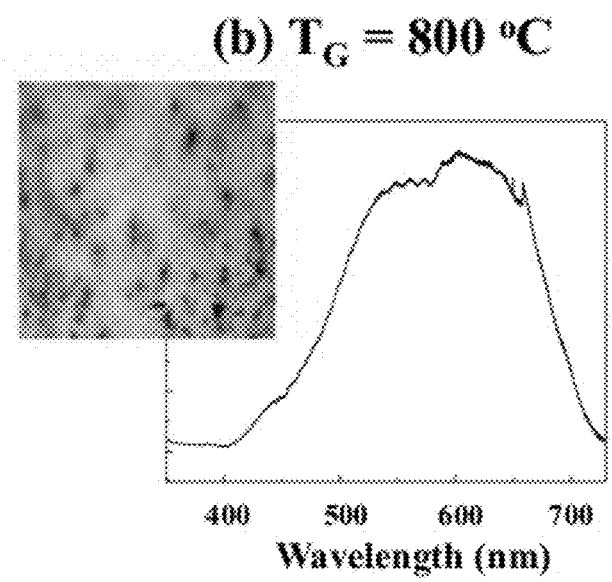

As shown in FIG. 3B, the photoluminescence spectra obtained from ZnS:Sn grown at 800° C. had a much broader band from 500 nm to 670 nm, and may consist of two contributions, i.e., emission from Zn vacancy states and $Sn^{2+/4+}$ states. The fluorescent image also showed green light contribution.

Figure 3C:
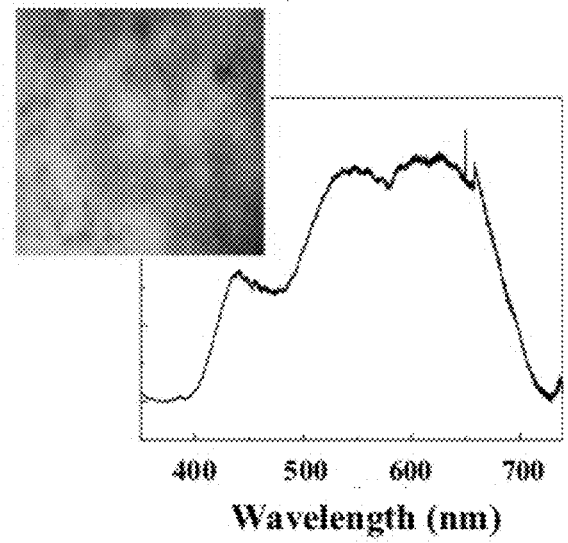

As shown in FIG. 3C, the photoluminescence spectra from ZnS:Sn synthesized at 780° C. had the broadest band starting from 400 nm to 700 nm with three distinct broader peaks. The peaks may be observed at approximately 440 nm, 540 nm, and 630 nm. The fluorescent image also showed much brighter spots.

Figure 3D:
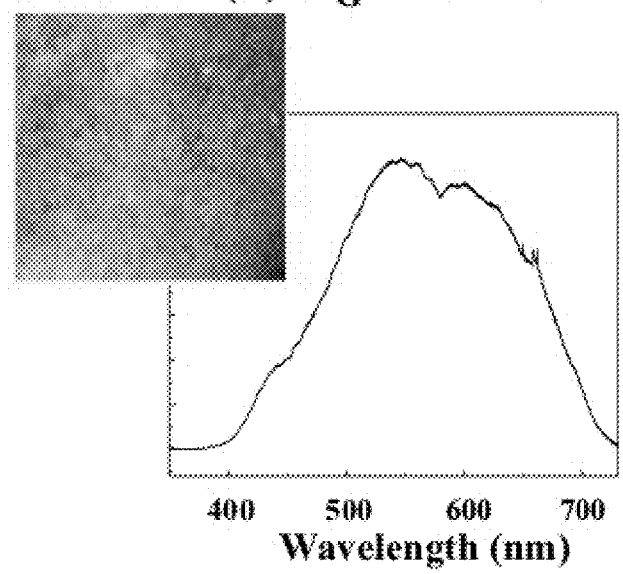

As shown in FIG. 3D, the photoluminescence spectra from ZnS:Sn grown at 730° C. may also show a broad band, but the contribution from 440 nm states may be negligible or very minute. It may have contributions from the green and red emission states. This may be reflected in the fluorescent image.

The photoluminescence measurements may confirm the following:

The presence and number of vacancy states strongly depend on the growth temperature, S vacancies were most sensitive to the growth temperature, and S vacancies were present on the surface of nanostructures.

In order to have substantial blue emission (due to S vacancies), the window of growth of ZnS:Sn nanostructures may be very small. The best results may come from ZnS:Sn nanowires grown at 780° C.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method of synthesizing tin (Sn)-doped Zinc Sulfide (ZnS) nanostructures for electroluminescent white light source, comprising:

coating a substrate, comprising a silicon oxide layer, with Sn by vacuuming depositing Sn as catalyst nanostructures on the substrate;

placing the substrate coated with Sn in a furnace;

introducing a carrier flow gas into the furnace;

adding a ZnS powder to the furnace;

growing ZnS nanostructures; and dissolving Sn in the growing ZnS nanostructures;

wherein S vacancies are on a surface of the ZnS nanostructures, wherein the ZnS nanostructures are grown on the substrate having a temperature in a range of 750° C. to 850° C., wherein the Sn self-doped ZnS nanostructures have broad emission in a range of 400 nm to 650 nm, wherein the deposited Sn is 2 nm or less, and wherein the ZnS nanostructures doped with Sn are grown on the substrate having a temperature of 780° C.

2. The method of claim 1, wherein blue, red, and green emissions of the ZnS nanostructures are controlled by growth conditions of Sn doped ZnS nanostructures.

3. The method of claim 1, wherein the carrier flow gas is a mixture of hydrogen and nitrogen gas is in a ratio of 1:4 that is introduced at flow rate of 30 Sccm.

\* \* \* \* \*